US010429468B2

(12) United States Patent
Cohen

(10) Patent No.: US 10,429,468 B2
(45) Date of Patent: Oct. 1, 2019

(54) SIMULTANEOUS DYNAMIC CONTRAST ENHANCED AND DYNAMIC SUSCEPTIBILITY MAGNETIC RESONANCE IMAGING USING MAGNETIC RESONANCE FINGERPRINTING

(71) Applicant: The General Hospital Corporation, Boston, MA (US)

(72) Inventor: Ouri Cohen, Teaneck, NJ (US)

(73) Assignee: The General Hospital Corporation, Boston, MA (US)

( * ) Notice: Subject to any disclaimer, the term of this patent is extended or adjusted under 35 U.S.C. 154(b) by 263 days.

(21) Appl. No.: 15/464,456

(22) Filed: Mar. 21, 2017

(65) Prior Publication Data
US 2017/0276753 A1    Sep. 28, 2017

Related U.S. Application Data

(60) Provisional application No. 62/313,209, filed on Mar. 25, 2016.

(51) Int. Cl.
*G01V 3/00* (2006.01)
*G01R 33/48* (2006.01)
*G01R 33/50* (2006.01)
*G01R 33/561* (2006.01)
*G01R 33/563* (2006.01)
*G01R 33/56* (2006.01)

(52) U.S. Cl.
CPC ....... *G01R 33/4806* (2013.01); *G01R 33/482* (2013.01); *G01R 33/50* (2013.01); *G01R 33/5616* (2013.01); *G01R 33/56366* (2013.01); *G01R 33/5601* (2013.01)

(58) Field of Classification Search
USPC ......................................................... 324/309
See application file for complete search history.

(56) References Cited

U.S. PATENT DOCUMENTS

2017/0299683 A1* 10/2017 Cohen ............. G01R 33/56366
2018/0031667 A1*  2/2018 Sarracanie ......... G01R 33/5659
2018/0210050 A1*  7/2018 Rosen ................ G01R 33/5605

* cited by examiner

*Primary Examiner* — Rodney E Fuller
(74) *Attorney, Agent, or Firm* — Quarles & Brady LLP

(57) ABSTRACT

Quantitative perfusion parameter maps can be generated based on multiple different relaxation parameter maps that are simultaneously produced from images acquired using contrast-enhanced magnetic resonance imaging ("MRI") techniques.

18 Claims, 3 Drawing Sheets

SIMULTANEOUS DYNAMIC CONTRAST ENHANCED AND DYNAMIC SUSCEPTIBILITY MAGNETIC RESONANCE IMAGING USING MAGNETIC RESONANCE FINGERPRINTING

CROSS-REFERENCE TO RELATED APPLICATIONS

This application claims the benefit of U.S. Provisional Patent Application Ser. No. 62/313,209, filed on Mar. 25, 2016, and entitled "SIMULTANEOUS DYNAMIC CONTRAST ENHANCED AND DYNAMIC SUSCEPTIBILITY MAGNETIC RESONANCE IMAGING USING MAGNETIC RESONANCE FINGERPRINTING."

BACKGROUND

Dynamic contrast-enhanced ("DCE") magnetic resonance imaging ("MRI") and dynamic susceptibility contrast ("DSC") MRI typically use T1-weighted or T2*-weighted images to characterize tissue perfusion properties. Generally, DCE-MRI and DSC-MRI are carried out as two separate scans.

The T1-weighted and T2*-weighted images include contributions from various sources that can lead to inaccuracies in the quantitative perfusion maps computed based on the T1-weighted and T2*-weighted images.

Additional sources of error include those caused by variations in the $B_0$ and $B_1$ fields. These additional error sources can typically be removed (e.g., by shimming), but these correction processes generally require additional scans thereby lengthening the total scan time.

Additionally, DCE-MRI and DSC-MRI scans require multiple contrast injections to reduce errors from leakage, which can be hazardous for people with compromised renal function.

Thus, there remains a need for a perfusion imaging method that can provide the information available from DCE-MRI and DSC-MRI, but with a reduced total scan time as well as the required number of contrast injections.

SUMMARY OF THE DISCLOSURE

The present disclosure addresses the aforementioned drawbacks by providing method for using a magnetic resonance imaging ("MRI") system to estimate quantitative perfusion parameters of a subject that has been administered a contrast agent. Optimized acquisition parameters are estimated. These acquisition parameters are optimized to direct the MRI system to generate a plurality of different signal evolutions that maximize discrimination between different magnetic resonance relaxation parameters in a minimized number of repetition time ("TR") periods. Contrast-enhanced data are acquired with the MRI system by directing the MRI system to perform a plurality of pulse sequences using the optimized acquisition parameters. This contrast-enhanced data represents the plurality of different signal evolutions. Longitudinal relaxation parameters and transverse relaxation parameters are simultaneously estimated by comparing the acquired contrast-enhanced data with a dictionary database comprising a plurality of different signal evolution templates. Quantitative perfusion parameters are then computed based on the longitudinal relaxation parameters and the transverse relaxation parameters.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
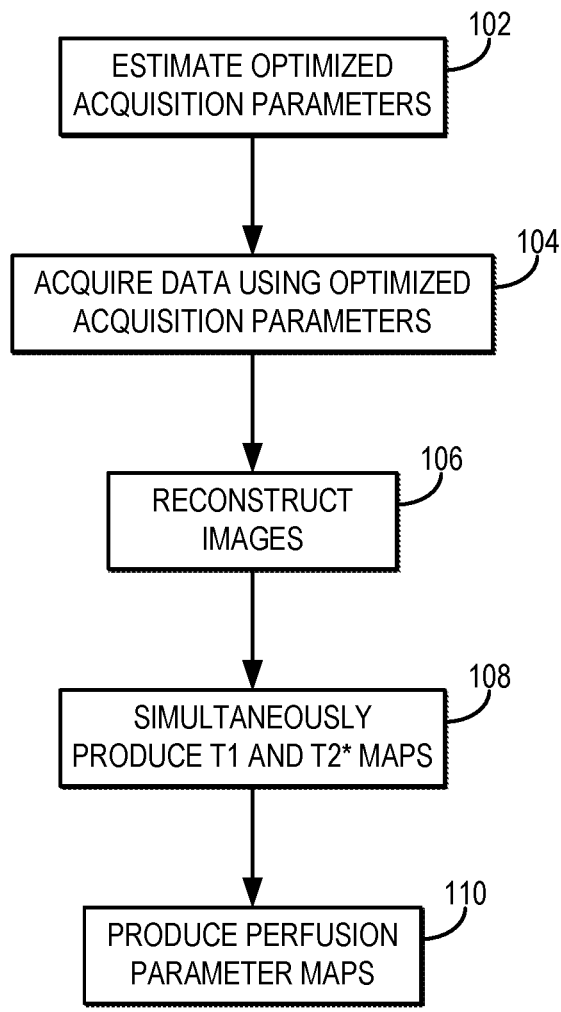
FIG. 1 is a flowchart setting forth the steps of an example of a method for estimating quantitative perfusion parameters from different, simultaneously estimated magnetic resonance relaxation parameters.

Described here are systems and methods for generating quantitative perfusion parameter maps based on multiple different relaxation parameter maps that are simultaneously produced from images acquired using contrast-enhanced magnetic resonance imaging ("MRI") techniques.

Dynamic contrast-enhanced ("DCE") MRI utilizes repeated imaging of a subject with a T1-weighted pulse sequence to measure changes in magnetic resonance signal intensity as a bolus of contrast agent diffuses or perfuses into the tissues being imaged. Example contrast agents include those containing gadolinium or other paramagnetic materials. Contrast agent concentration curves (e.g., the arterial input function, or AIF) in plasma can be computed from these images, in addition to a measurement of the contrast agent accumulation in the tissue over time. From these data, quantitative parameters can be computed using pharmacokinetic modeling. Examples of quantitative parameters that can be generated using pharmacokinetic modeling techniques include transfer coefficient, $K_{trans}$, which provides a quantitative measurement of signal enhancement.

Dynamic susceptibility contrast ("DSC") MRI utilizes a decrease in magnetic resonance signal in T2-weighted images caused by the passage of a contrast agent through the tissues being imaged. Example contrast agents include those containing gadolinium or other paramagnetic materials. The decrease in signal is proportional to the concentration of the contrast agent and the tissue vascularity and, thus, can be used to compute quantitative parameters associated with tissue perfusion.

Both DCE-MRI and DSC-MRI require administering a contrast agent to the subject being imaged and, therefore, to perform both DCE-MRI and DSC-MRI on a subject, two separate scans and multiple different contrast administrations are required.

The systems and methods of the present disclosure overcome this drawback by utilizing an optimized magnetic resonance fingerprinting ("MRF") technique to simultaneously produce multiple different magnetic resonance relaxation parameter maps (e.g., T1 maps, T2 maps, T2* maps), from which quantitative parameter maps can be generated. Thus, compared to traditional DCE-MRI and DSC-MRI techniques, the systems and methods of the present disclosure do not require conducting separate scans of the subject, which permits reducing the number of contrast doses required and shortening the total scan time. The high temporal resolution afforded by this technique, in addition to the quantitative nature of the relaxation maps, provides a reduction in errors in the computed perfusion maps.

In general, MRF techniques utilize a data acquisition scheme that causes signals from different materials or tissues to be spatially and temporally incoherent by continuously varying acquisition parameters throughout the data acquisition process. Examples of acquisition parameters that can be varied include flip angle ("FA"), radio frequency ("RF") pulse phase, repetition time ("TR"), echo time ("TE"), and sampling patterns, such as by modifying readout encoding gradients. In typical MRF approaches, the acquisition parameters are generally varied in a pseudorandom manner.

As a result of the spatial and temporal incoherence imparted by an acquisition scheme utilizing multiple parameter values, each material or tissue is associated with a unique signal evolution or "fingerprint," that is a function of multiple different physical parameters, including longitudinal relaxation time, T1; transverse relaxation time, T2; main magnetic field map, $B_0$; and proton density, $\rho$.

Quantitative parameter maps are then generated from the acquired signals based on a comparison of the signals to a predefined dictionary of predicted signal evolutions. Each of these dictionaries is associated with different combinations of materials and acquisition parameters. As an example, the comparison of the acquired signals to a dictionary can be performed using any suitable matching or pattern recognition technique. This comparison results in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

In the systems and methods described here, an optimized schedule of acquisition parameters (e.g., FA, TR) is generated based on anatomical T1/T2 values. This optimization maximizes discrimination between signal magnetization from different tissues, and in turn drastically reduces the number of measurements required to produce relaxation maps from which quantitative perfusion parameter maps can be produced. In combination with a modified echo-planar-imaging ("EPI") pulse sequence, the optimized sequence is capable of yielding simultaneous, quantitative T1 and T2* maps in about 1.6 seconds per slice, avoiding the need for a separate scan to determine the quantitative T1 map, as is common in DCE-MRI.

Using pharmacokinetic models, the time-signal course of the T1/T2 relaxation in each voxel can be converted to perfusion parameters, such as $K_{trans}$, area under the curve ("AUC"), and cerebral blood volume ("CBV").

Referring now to FIG. 1, a flowchart is illustrated as setting forth the steps of one non-limiting example method for producing a quantitative map of a perfusion parameter from data acquired using acquisition parameters that have been selected to reduce the number of acquisitions necessary to desirably sample the relaxation parameter space. The method begins by generating a vector, or schedule, of acquisition parameters that has been selected (or, as a non-limiting example, optimized) to reduce the number of acquisitions necessary to sufficiently sample the relaxation parameter space, as indicated at step 102.

By way of example, the selection or optimization of acquisition parameters, such as FA and TR, may include providing an initial, randomly-generated seed vector of the acquisition parameters to be selected or optimized. This seed vector may have a length, N, and may be used to simulate the signal for a range, P, of relaxation parameters. As mentioned above, the systems and methods of the present disclosure include simultaneously estimating both T1 and T2; thus, a first range, $P_1$, of T1 values can be used together with a second range, $P_2$, of T2 values. The seed vector and simulated relaxation parameters are used to form an $N \times (P_1 + P_2)$ matrix, A. This matrix, A, can then be used to calculate a dot product matrix, $$D = A^T A \qquad (1).$$

The diagonal elements of this dot product matrix, D, indicate the closeness of a match between a schedule resulting from a given relaxation parameter (e.g., T1) and itself. The diagonal elements are, therefore, equal to one. The off-diagonal elements of the dot product matrix, D, however, indicate the quality of matching between every two different elements of the matrix, A. Discriminating between T1 and T2 values in the matching process requires that the dot product of a measured trajectory with the pre-computed trajectory that is stored in the dictionary be high for the correct T1 and T2 values and, ideally, zero for all others. To find the vector of acquisition parameters (e.g., TRs and FAs) that yield this optimum value, or a value that is otherwise sufficiently desirable, a model can be utilized. One non-limiting example of a model is the following optimization problem:

$$\min_x f(x) \text{ such that } \sum_{i \neq j} D_{ij}(x) - \lambda \sum_{i=j} D_{ij}(x); \qquad [2]$$

where $f(x)$ is the function to simulate the schedule and compute the dot product matrix, D, given a vector, x, of acquisition parameters. A penalty term, $\lambda$, is applied as well to avoid minimizing the on-diagonal elements. Another non-limiting example of a model that can be used is the following:

$$\min_x f(x) = \frac{\sum_{i \neq j} D_{ij}(x)}{\sum_{i=j} D_{ij}(x)}; \qquad [3]$$

where the ratio of off-diagonal to diagonal elements is minimized. Another non-limiting example of a model than can be used is the following:

$$\min_x \|I - D(x)\|_F^2; \qquad [4]$$

where x represents the acquisition schedule and $\| \ldots \|_F$ is the Frobenius norm. As one example, a constrained non-linear solver can be used to solve Eqns. (2), (3), or (4).

Using the optimized schedule reduces the total number of acquisitions needed to sufficiently sample the physical parameter space, but also samples this physical parameter space in a manner that increases the discrimination between different parameters, thereby reducing the scan time required to perform MRF. Additional time savings can be achieved by using rapid data acquisition schemes, such as EPI and segmented EPI.

Referring again to FIG. 1, the method for estimating perfusion parameters continues by acquiring data by directing an MRI system to perform pulse sequences using the optimized acquisition parameters, as indicated at step 104. The pulse sequence can be any suitable pulse sequence for obtaining MRF data, but in some embodiments the pulse sequence used can be an EPI pulse sequence, which may be a spin-echo ("SE") EPI sequence or a gradient-recalled echo ("GRE") EPI sequence.

Using an EPI pulse sequence has the added benefit that k-space can be fully sampled in a rapid fashion, which reduces the total number of required acquisitions, and therefore contrast doses. Reducing the total number of acquisitions not only provides a time saving measure and a reduction in contrast doses administered to the subject, but also reduces the computational burden of matching the acquired data to a pre-computed dictionary because a smaller dictionary can be used with the reduced number of acquisitions.

Figure 2:
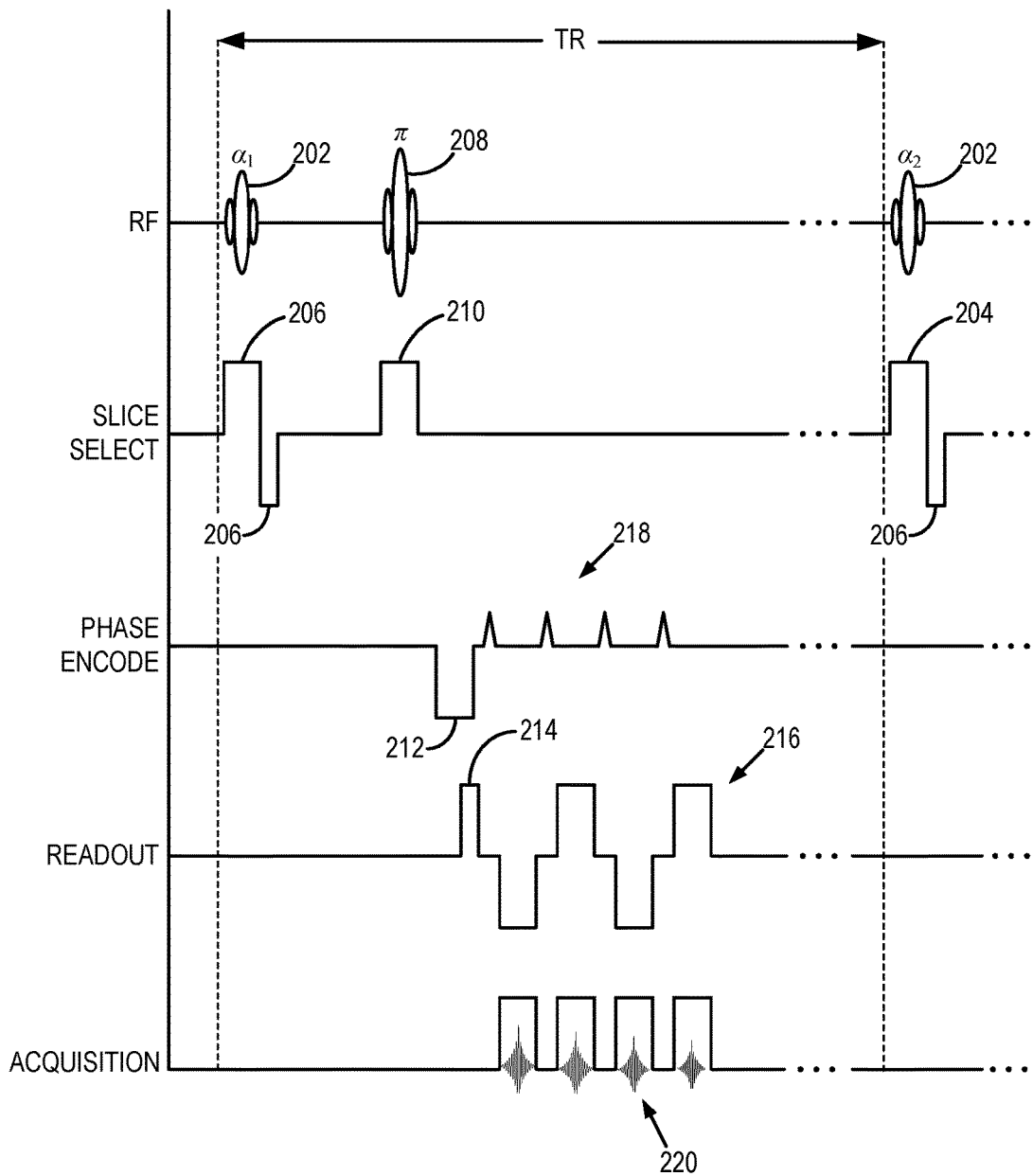
FIG. 2 is a pulse sequence diagram illustrating an example spin-echo echo-planar imaging (EPI) pulse sequence that can be used to acquire contrast-enhanced data.

Referring specifically now to FIG. 2, an example pulse sequence diagram of a modified spin-echo EPI technique for use in accordance with some implementations of the systems and methods of the present disclosure, is shown. Specifically, for each TR, a selective RF excitation pulse 202 is played out in the presence of a slice select gradient pulse 204. In general spin-echo EPI sequences, the flip angle, a, values of the RF excitations are usually 90 degrees to maximize the signal to noise ratio ("SNR"). By contrast, the present disclosure employs a variable FA, $\alpha$, that may be varied according to the optimized acquisition parameters, unlike previous MRF approaches that utilize pseudo-randomized parameter values.

The slice select gradient pulse 204 is followed by a rephasing pulse 206, which operates to rephase excited spins in the selected slice. Subsequently, to facilitate the formation of spin echoes, the orientation of the transverse magnetization of excited spins may be reversed by application of a selective 180 degree RF excitation pulse 208 produced in the present of a slice select gradient pulse 210. Readout and phase-encoding waveforms are played following RF excitation 202 to produce a series of spatially encoded echoes 220. Specifically, following a phase encode pre-phase pulse 212 and readout pre-phase pulse 214 that determine a starting k-space sampling position, a plurality of gradient waveforms are played out for traversing k-space in accordance with a desired trajectory. In some configurations, this trajectory is a Cartesian k-space trajectory.

Following the readout pre-phase gradient pulse 214, a series of readout gradient pulses 216 with alternating polarity are played along the readout direction to produce a series of spin-echo signals 220. Specifically, the readout gradient pulses 216 are spaced apart, and phase-encoding gradient blips 218 are played out therebetween to separately phase encode each acquired echo 220. In particular, there is a separate readout gradient pulse 216 and phase-encoding gradient blip 218 for each view of k-space that is to be acquired. In this manner, multiple views may be acquired for each excitation in the TR, to encompass either k-space segments or fully sample k-space in accordance with the Nyquist criterion. Advantageously, fully sampled k-space on a Cartesian grid avoids a regridding and simplifies the reconstruction process.

Depending on the duration of the TR, in accordance with aspects of the present disclosure, multiple slices may be acquired during each scan. For instance, delays associated with wait times necessary for magnetization recovery of successive phase encoding k-space lines may limit total scan times. Thus, in certain applications, these otherwise dead times may be utilized for acquisition of multiple slices to facilitate three-dimensional ("3D") data acquisition. For instance, in some embodiments, a segmented EPI sequence may also be used, depending on the desired resolution and tissue parameter values. For such acquisitions, a wait time, $\Delta T$, may be needed following each segment to ensure the initial magnetization is the same for all segments. During the wait time, additional slices can be acquired, for example, if 3D acquisition is desired. As such, after a last phase-encoding k-space line of a segment is acquired for a particular slice, additional k-space segments from other slices may be interleaved therein.

In the manner described, multiple acquisitions can be performed, wherein scan parameter values for each acquisition can vary from one excitation to the next. For example, ten acquisitions can take place in a manner described above, although other values are possible. In some aspects, TR, FA, and other parameter values may be varied in accordance with optimized or desired trajectories, such as those described above; in a random manner; or in a pseudorandom manner. The parameters can be varied sequentially, simultaneously, or in accordance with a differential sensitivity requirement for specific parameters of interest.

Referring again to FIG. 1, the method continues by reconstructing images from the acquired data, as indicated at step 106. When an EPI sequence that sampled k-space along a Cartesian trajectory is used to acquire the data, reconstruction can be achieved using a conventional Fourier transform-based reconstruction, which introduces another reduction in the computational burden compared to conventional MRF applications that require complex reconstruction techniques to reconstruct images from data acquired using non-Cartesian trajectories.

Relaxation parameters are then estimated by, for example, matching the reconstructed images to one or more pre-computed dictionaries, as indicated at step 108. Conventional matching algorithms can be used; however, in some configurations, an adaptive matching algorithm, such as the one described in co-pending PCT Application No. PCT/US15/11948, which is herein incorporated by reference in its entirety, can also be used.

Perfusion parameter maps can then be generated using the estimated relaxation parameters, as indicated at step 110. Non-limiting examples of perfusion parameters that can be estimated include $K_{trans}$, area under the curve ("AUC"), blood flow (e.g., cerebral blood flow ("CBF")), blood volume (e.g., cerebral blood volume ("CBV")), and mean transit time ("MTT"). In some embodiments, pharmacokinetic modeling is used to estimate the perfusion parameters from the relaxation parameters.

Figure 3:
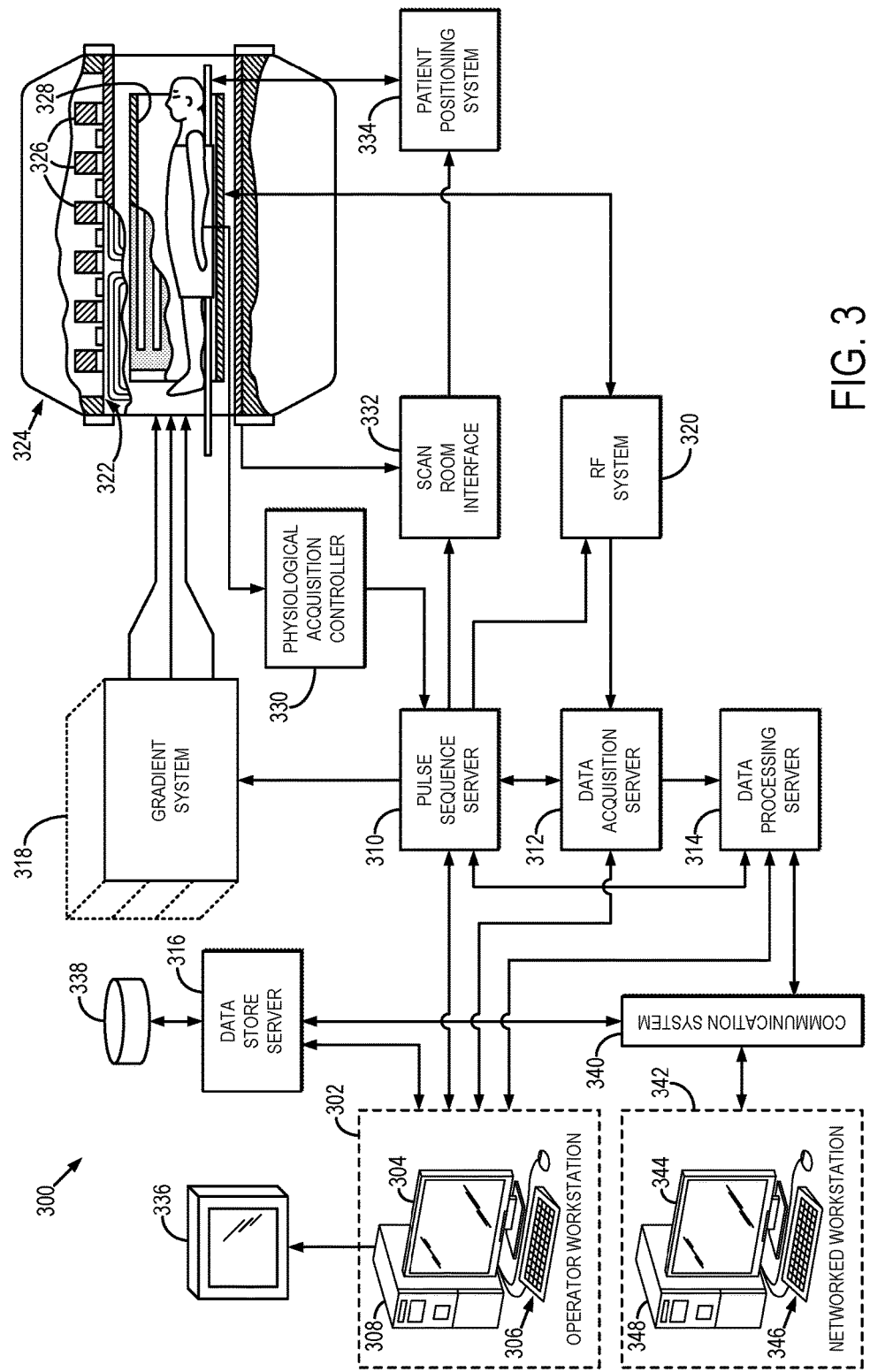
FIG. 3 is a block diagram of an example magnetic resonance imaging (MRI) system that can implement methods described here.

Referring particularly now to FIG. 3, an example of a magnetic resonance imaging ("MRI") system 300 that can implement the methods described here is illustrated. The MRI system 300 includes an operator workstation 302 that may include a display 304, one or more input devices 306 (e.g., a keyboard, a mouse), and a processor 308. The processor 308 may include a commercially available programmable machine running a commercially available operating system. The operator workstation 302 provides an operator interface that facilitates entering scan parameters into the MRI system 300. The operator workstation 302 may be coupled to different servers, including, for example, a pulse sequence server 310, a data acquisition server 312, a data processing server 314, and a data store server 316. The operator workstation 302 and the servers 310, 312, 314, and 316 may be connected via a communication system 340, which may include wired or wireless network connections.

The pulse sequence server 310 functions in response to instructions provided by the operator workstation 302 to operate a gradient system 318 and a radiofrequency ("RF") system 320. Gradient waveforms for performing a prescribed scan are produced and applied to the gradient system 318, which then excites gradient coils in an assembly 322 to produce the magnetic field gradients $G_x$, $G_y$, and $G_z$ that are used for spatially encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil to perform the prescribed magnetic resonance pulse sequence. Responsive magnetic resonance signals detected by the RF coil 328, or a separate local coil, are received by the RF system 320. The responsive magnetic resonance signals may be amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the prescribed scan and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. An RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \quad (5)$$

and the phase of the received magnetic resonance signal may also be determined according to the following relationship:

$$\varphi = \tan^{-1}\left(\frac{Q}{I}\right). \quad [6]$$

The pulse sequence server 310 may receive patient data from a physiological acquisition controller 330. By way of example, the physiological acquisition controller 330 may receive signals from a number of different sensors connected to the patient, including electrocardiograph ("ECG") signals from electrodes, or respiratory signals from a respiratory bellows or other respiratory monitoring devices. These signals may be used by the pulse sequence server 310 to synchronize, or "gate," the performance of the scan with the subject's heart beat or respiration.

The pulse sequence server 310 may also connect to a scan room interface circuit 332 that receives signals from various sensors associated with the condition of the patient and the magnet system. Through the scan room interface circuit 332, a patient positioning system 334 can receive commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, so that data is not lost by data overrun. In some scans, the data acquisition server 312 passes the acquired magnetic resonance data to the data processor server 314. In scans that require information derived from acquired magnetic resonance data to control the further performance of the scan, the data acquisition server 312 may be programmed to produce such information and convey it to the pulse sequence server 310. For example, during pre-scans, magnetic resonance data may be acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also process magnetic resonance signals used to detect the arrival of a contrast agent in a magnetic resonance angiography ("MRA") scan. For example, the data acquisition server 312 may acquire magnetic resonance data and processes it in real-time to produce information that is used to control the scan.

The data processing server 314 receives magnetic resonance data from the data acquisition server 312 and processes the magnetic resonance data in accordance with instructions provided by the operator workstation 302. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 314 are conveyed back to the operator workstation 302 for storage. Real-time images may be stored in a data base memory cache, from which they may be output to operator display 302 or a display 336. Batch mode images or selected real time images may be stored in a host database on disc storage 338. When such images have been reconstructed and transferred to storage, the data processing server 314 may notify the data store server 316 on the operator workstation 302. The operator workstation 302 may be used by an operator to archive the images, produce films, or send the images via a network to other facilities.

The MRI system 300 may also include one or more networked workstations 342. For example, a networked workstation 342 may include a display 344, one or more input devices 346 (e.g., a keyboard, a mouse), and a processor 348. The networked workstation 342 may be located within the same facility as the operator workstation 302, or in a different facility, such as a different healthcare institution or clinic.

The networked workstation 342 may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342.

The present disclosure has described one or more preferred embodiments, and it should be appreciated that many equivalents, alternatives, variations, and modifications, aside from those expressly stated, are possible and within the scope of the invention.

The invention claimed is:

1. A method for using a magnetic resonance imaging (MRI) system to estimate quantitative perfusion parameters of a subject that has been administered a contrast agent, the steps of the method comprising:
   (a) estimating optimized acquisition parameters that are optimized to direct the MRI system to generate a plurality of different signal evolutions that maximize discrimination between different magnetic resonance relaxation parameters in a minimized number of repetition time (TR) periods;
   (b) acquiring contrast-enhanced data with the MRI system by directing the MRI system to perform a plurality of pulse sequences using the optimized acquisition parameters, the acquired contrast-enhanced data representing the plurality of different signal evolutions;
   (c) simultaneously estimating longitudinal relaxation parameters and transverse relaxation parameters by comparing the acquired contrast-enhanced data with a dictionary database comprising a plurality of different signal evolution templates; and
   (d) computing quantitative perfusion parameters based on the longitudinal relaxation parameters and the transverse relaxation parameters.

2. The method as recited in claim 1, wherein the longitudinal relaxation parameters include at least one of longitudinal relaxation time (T1) or longitudinal relaxation rate (R1), and the transverse relaxation parameters include at least one of transverse relaxation time (T2), transverse relaxation rate (R2), apparent transverse relaxation time (T2*), or apparent transverse relaxation rate (R2*).

3. The method as recited in claim 1, wherein step (d) includes computing at least one of blood volume, blood flow, or mean transit time.

4. The method as recited in claim 3, wherein the blood volume is a cerebral blood volume and the blood flow is a cerebral blood flow.

5. The method as recited in claim 1, wherein step (d) includes using pharmacokinetic modeling to compute at least one of transfer coefficient ($K_{trans}$) or area under the curve (AUC).

6. The method as recited in claim 1, wherein step (b) includes acquiring the contrast-enhanced data using an echo-planar imaging (EPI) pulse sequence that samples k-space during each of a plurality of different TR periods and such that the contrast-enhanced data acquired during each TR period represents a plurality of different signal evolutions acquired using different acquisition parameter settings.

7. The method as recited in claim 6, wherein the EPI pulse sequence samples k-space along a Cartesian trajectory.

8. The method as recited in claim 6, wherein the EPI pulse sequence samples k-space by undersampling k-space.

9. The method as recited in claim 6, wherein the EPI pulse sequence is a spin-echo EPI pulse sequence.

10. A magnetic resonance imaging (MRI) system, comprising:
   a magnet system that generates a polarizing magnetic field about at least a portion of a subject arranged in the magnet system;
   a plurality of gradient coils configured to apply a gradient field to the polarizing magnetic field along each of at least three directions;
   a radio frequency (RF) system configured to apply an excitation field to the subject and acquire magnetic resonance data therefrom;
   a computer system programmed to:
      estimate optimized acquisition parameters that are optimized to direct the plurality of gradient coils and the RF system to generate a plurality of different signal evolutions that maximize discrimination between different magnetic resonance relaxation parameters in a minimized number of repetition time (TR) periods;
      direct the plurality of gradient coils and the RF system to perform a plurality of pulse sequences using the optimized acquisition parameters in order to acquire contrast-enhanced data that represents the plurality of different signal evolutions; and
      simultaneously estimate longitudinal relaxation parameters and transverse relaxation parameters by comparing the acquired contrast-enhanced data with a dictionary database comprising a plurality of different signal evolution templates; and
      compute quantitative perfusion parameters based on the longitudinal relaxation parameters and the transverse relaxation parameters.

11. The MRI system as recited in claim 10, wherein the computer system estimates the longitudinal relaxation parameters as at least one of longitudinal relaxation time (T1) or longitudinal relaxation rate (R1), and the computer system estimates the transverse relaxation parameters as at least one of transverse relaxation time (T2), transverse relaxation rate (R2), apparent transverse relaxation time (T2*), or apparent transverse relaxation rate (R2*).

12. The MRI system as recited in claim 10, wherein the computer system is programmed to compute the quantitative perfusion parameters as one of at least blood volume, blood flow, or mean transit time.

13. The MRI system as recited in claim 12, wherein the computer system is programmed to compute the blood volume as a cerebral blood volume and to compute the blood flow as a cerebral blood flow.

14. The MRI system as recited in claim 10, wherein the computer system is programmed to compute the quantitative perfusion parameters using pharmacokinetic modeling to compute at least one of transfer coefficient ($K_{trans}$) or area under the curve (AUC).

15. The MRI system as recited in claim 10, wherein the computer system is programmed to direct the plurality of gradient coils and the RF system to perform the plurality of pulse sequences as echo-planar imaging (EPI) pulse sequences that sample k-space during each of a plurality of different TR periods and such that the contrast-enhanced data acquired during each TR period represents a plurality of different signal evolutions acquired using different acquisition parameter settings.

16. The MRI system as recited in claim 15, wherein the computer system is programmed to direct the plurality of gradient coils and the RF system to perform the plurality of pulse sequences as echo-planar imaging (EPI) pulse sequences that sample k-space along a Cartesian trajectory.

17. The MRI system as recited in claim 15, wherein the computer system is programmed to direct the plurality of gradient coils and the RF system to perform the plurality of pulse sequences as echo-planar imaging (EPI) pulse sequences that undersample k-space.

18. The MRI system as recited in claim 16, wherein the computer system is programmed to direct the plurality of gradient coils and the RF system to perform the plurality of pulse sequences as echo-planar imaging (EPI) pulse sequences that are spin-echo EPI pulse sequences.

\* \* \* \* \*

UNITED STATES PATENT AND TRADEMARK OFFICE
CERTIFICATE OF CORRECTION

PATENT NO. : 10,429,468 B2
APPLICATION NO. : 15/464456
DATED : October 1, 2019
INVENTOR(S) : Ouri Cohen It is certified that error appears in the above-identified patent and that said Letters Patent is hereby corrected as shown below:

In the Specification

Column 5, Line 25, "angle, a" should be --angle, α--.

Signed and Sealed this
Twelfth Day of November, 2019

Andrei Iancu
*Director of the United States Patent and Trademark Office*